United States Patent
Yeh et al.

(10) Patent No.: US 6,319,807 B1
(45) Date of Patent: Nov. 20, 2001

(54) METHOD FOR FORMING A SEMICONDUCTOR DEVICE BY USING REVERSE-OFFSET SPACER PROCESS

(75) Inventors: Wen-Kuan Yeh, Chu-Pei; Tony Lin, Hsin-Chu, both of (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/498,861

(22) Filed: Feb. 7, 2000

(51) Int. Cl.[7] .................................................. H01L 21/3205
(52) U.S. Cl. ........................ 438/595; 438/289; 438/299; 438/303; 438/305; 438/592; 438/652
(58) Field of Search .................................... 438/289, 290, 438/299, 301, 303, 305, 306, 307, 592, 595, 652, 655, 656, 657

(56) References Cited

U.S. PATENT DOCUMENTS 5,856,225 * 1/1999 Lee et al. .............................. 438/291
6,087,208 * 7/2000 Krivokapic et al. ................. 438/183

* cited by examiner

Primary Examiner—Charles Bowers
Assistant Examiner—Jack Chen
(74) Attorney, Agent, or Firm—Powell, Goldstein, Frazer & Murphy LLP

(57) ABSTRACT

A method for forming semiconductor devices is disclosed. The method of the present invention includes providing a semiconductor substrate, followed by forming shallow trench isolation (STI) process, and then a dummy gate is formed by silicon nitride layer which is deposited and defined. With appropriate wet etching, this dummy poly can be removed. After local punch-through implantation, reverse offset spacer is formed to reduce Cgd (capacitance is between gate and drain) and poly-CD (critical dimension). Polysilicon is deposited followed by polysilicon CMP. After thick Ti-salicidation, the usual CMOS (Complementary Metal-Oxide-Semiconductor) processes are proceeded.

13 Claims, 7 Drawing Sheets

METHOD FOR FORMING A SEMICONDUCTOR DEVICE BY USING REVERSE-OFFSET SPACER PROCESS

BACKGROUND OF THE INVENTION

1. Field of the Invention

The present invention relates generally to a method of manufacturing semiconductor devices, and more particularly to, a method for forming a Metal-Oxide-Semiconductor devices having reverse-offset spacer.

2. Description of the Prior Art

As semiconductor devices, such as Metal-Oxide-Semiconductors, become highly integrated, the area occupied by the devices shrinks, as well as the design rule.

A cross-sectional view of a Metal-Oxide-semiconductor device of the know prior art is illustrated in FIG. 1. A semiconductor substrate 20 is a silicon substrate. The semiconductor substrate includes shallow trench isolation 22, and which collocates to form a gate oxide layer 24 and a gate 26 on the surface of the semiconductor substrate 20. Lightly doping drain regions 30 formed in the semiconductor substrate 20 after an ion implantation is performed, and then an oxide spacer 32 are formed on the sidewall of gate 26. Then, source/drain regions 28 are formed in the substrate 20, so as to perform heavily doping of ion implantation. Obviously, the gate width is fixed and is correspondent with effective channel length. Moreover, a small size of the semiconductor device is fabricated for producing a high speed semiconductor device. Thus, the effective channel length of the gate has to be reduced, but the length of the Metal-Oxide-Semiconductor device can not be unlimitedly reduced, because the length of channel is reduced to result in variable derivational problem. Hence, this phenomenon is called "Short Channel Effect".

As the device continuously shrinks to sub-quarter micron regime, since poly gate lithography is the key limitation, it is very difficult to keep good performance on Poly gate CD (Critical Dimension) control. By the way, Ti or Co silicide will be more difficult to form on sub-quarter micron, due to the line-width effect and shallow junction issue.

And yet, in accompanying with the shrinkage of devices, the thickness of the gate can be not too thick from the conventional process of the small size. If the thickness of the gate is too thick, it will result in the source/drain junction issue. Thicker silicon substrate is consumed at the source/drain region, when silicide is formed by means of using rapid thermal processing. Hence, results in shallower junctions. In order to avoid the formation of junctions leakage, the thickness of silicide layer at the source/drain region must be thinner enough as devices shrink in size.

When the size of the element is reduced, the surface joint in the source/drain must be shallow to match up with, so the short channel effect could be avoided. Moreover, the size of the gate is fixed within the conventional process, due to the overlapped channel can not be reduced. Herein, overlapped channel was formed by way of the source/drain extension at high temperature.

In deep sub-micron device fabrication, the process treats the salicide on the source/drain that is important and comprehensive application. The above can be accomplished by either using simple silicidation of source/drain. It will be difficult to deal with the salicide on the gate, while the size of the gate is considerably small.

In accordance with the above description, a new and improved method for fabricating the Metal-Oxide-Semiconductor device is therefore necessary, so as to raise the yield and quality of the follow-up process.

SUMMARY OF THE INVENTION

In accordance with the present invention, a method is provided for fabricating Metal-Oxide-Semiconductor devices that substantially overcomes drawbacks of above mentioned problems arised from the conventional methods.

Accordingly, it is an object of the present invention to provide a method for fabricating Metal-Oxide-Semiconductor devices, having a reverse offset-spacer, so as to form small size high speed and high performance elements or CPU (central processing unit). By means of forming the reverse offset-spacer for reducing the Poly-CD (critical dimension), an overlapped length can be controlled with an appropriate structure. Due to combination with local punch-through implantation, junction capacitance can be significantly reduced.

Another object of the present invention is to reduce effective channel length only by way of forming the reverse offset spacer; Hence, the limitation of the lithography process can be improved by the reverse offset spacer. The effective poly line-width can be increased by salicidation herein; Thus, the narrow line-width effect of the salicide can be reduced by this structure.

A further object of the present invention is to form the thinner silicide at source/drain regions with this structure which has reverse offset-spacer; Thus, good ultra-shallow junction integrity can be obtained.

In accordance with the present invention, a method for forming semiconductor devices is disclosed. In one embodiment of the present invention, a semiconductor substrate having shallow trench isolation (STI) regions is provided. Firstly, a silicon nitride films is deposited on the semiconductor substrate that comprises shallow trench isolation region. Thus, a dummy gate can be formed on the substrate by means of defined process. And then a silicon dioxide films is deposited again on the substrate after carried out the lightly doped drain. Then, the oxide spacer is formed on the wall-side of the dummy gate with appropriate anisotropic etching. Moreover, the heavily doped drain process is carried out to form the source/drain. The final stage would be an annealing process. After source/drain extension formation, oxide spacer and source/drain deep junction are formed, and thinner salicide is formed to keep good junction integrity. Then, a thick films of the ILD (Inter Layer Dielectric) layer is deposited followed by post ILD CMP (Chemical Mechanical Polishing) stop layer on this dummy gate. With appropriate wet etching in a wet phosphoric acid solution, this dummy gate can be removed. After local punch-through implantation, reverse offset spacer was formed. Polysilicon is deposited followed by polysilicon CMP stop on the thickness of the dummy gate, thus, a reverse polysilicon can be obtained. Final, thick Ti-salicidation is carried out.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Although specific embodiments have been illustrated and described, it will be obvious to those skilled in the art that various modifications may be made without departing from what is intended to be limited solely by the appended claims.

Figure 1:
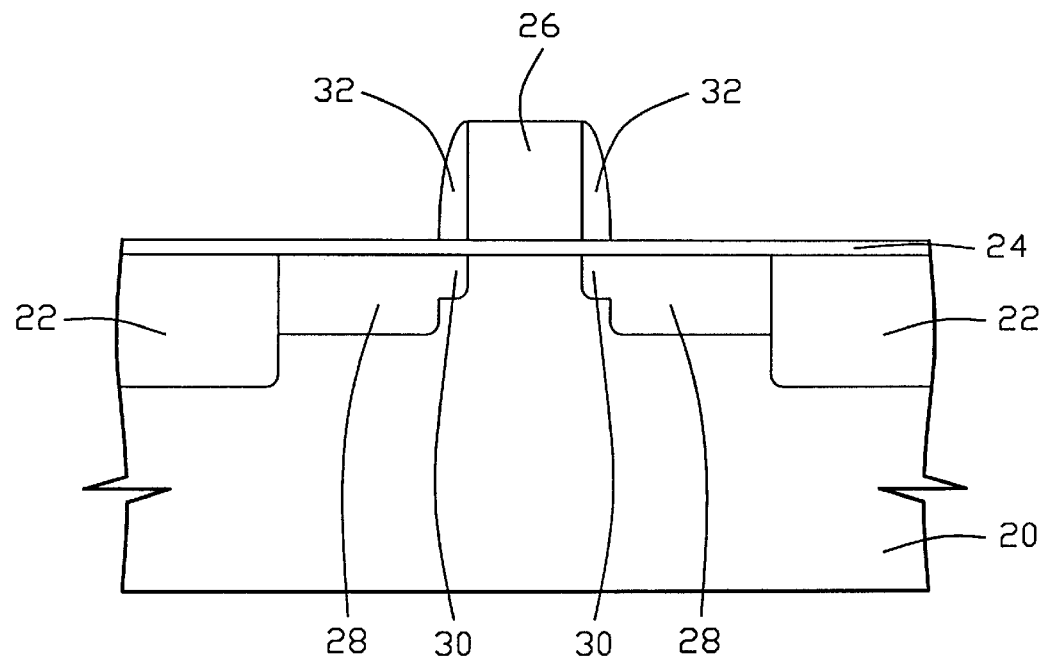
FIG. 1 show the cross section of a conventional complimentary metal-oxide-semiconductor device.
Figure 2A:
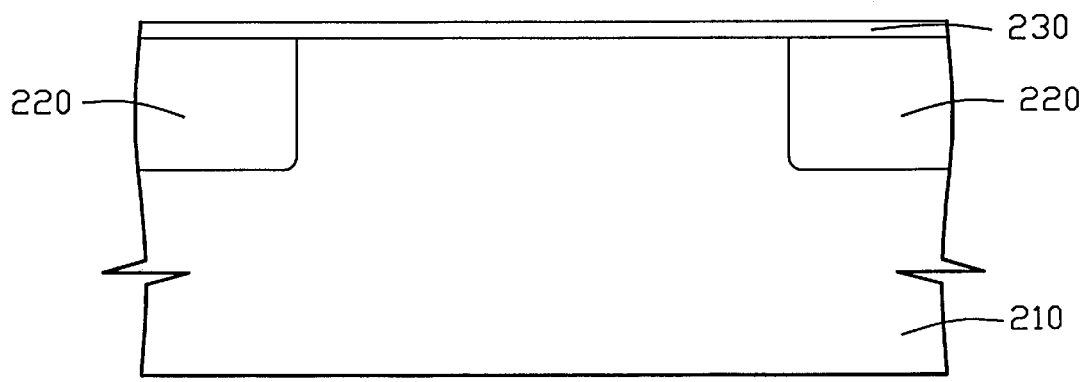
FIG. 2A to 2L shows cross-sectional views illustrative of various stages in the fabrication of a complimentary metaloxide-semiconductor device having reverse-offset spacer in accordance with one embodiment of the present invention.

As illustrated in FIG. 2A, firstly, a semiconductor substrate 210 including a shallow trench isolation region 220 and a gate oxide layer 230 is provided. Shallow trench isolation regions 220 and gate oxide layer 230 are formed by means of conventional shallow trench isolation process and silicon dioxide process respectively, and both the materials are silicon dioxide. Since the above processes are well known in the prior art, which are not the focus of the present invention, hence will not be described in greater details.

Figure 2B:
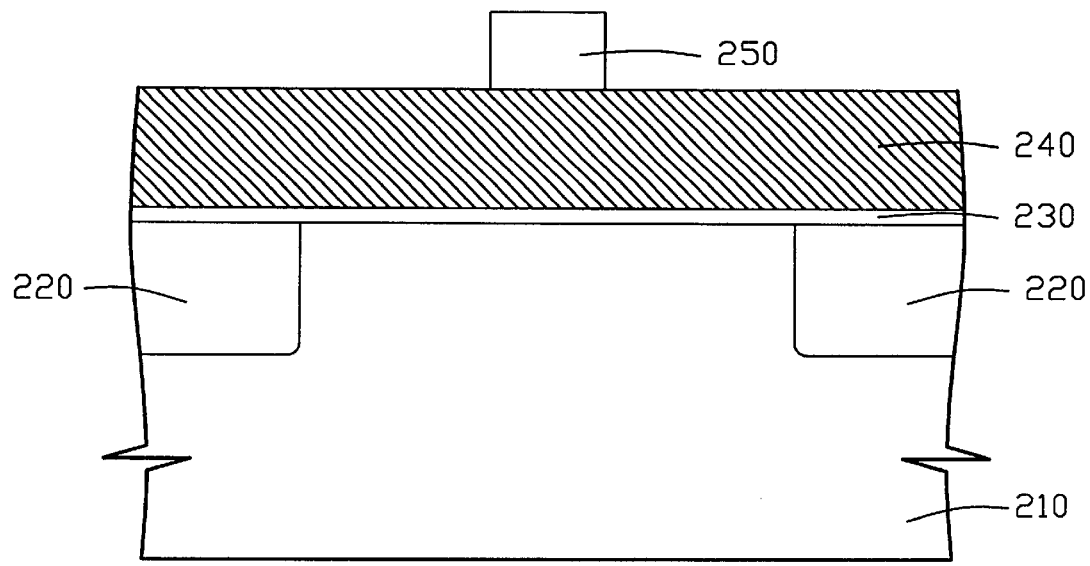
Figure 2C:
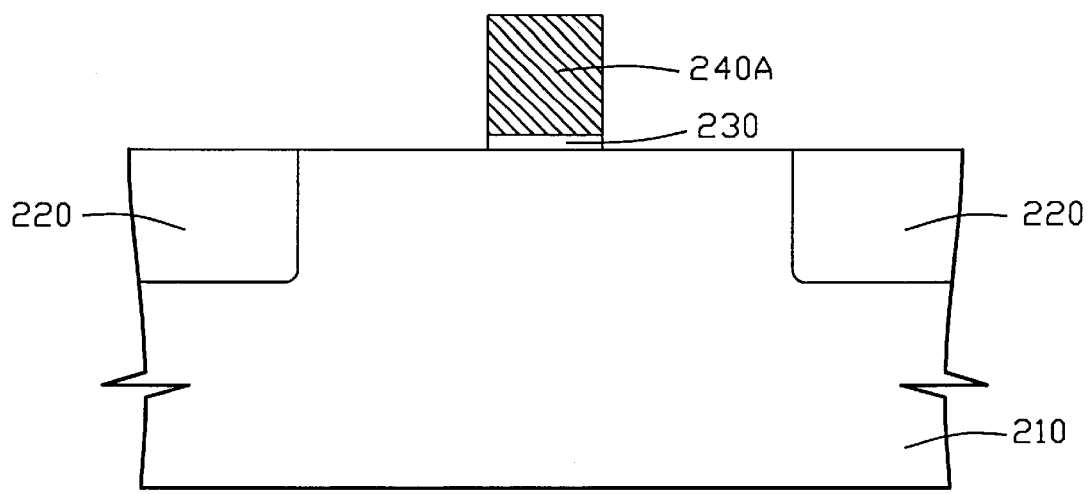

Referring to FIG. 2B, in this embodiment, the silicon nitride layer 240 is deposited on the semiconductor substrate 210 by a standard low pressure chemical vapor deposition (LPCVD) method. And then, a dummy gate 240A is defined and formed on the substrate 210 by the conventional lithography and photoresist layer 250, as shown in FIG. 2C.

Figure 2D:
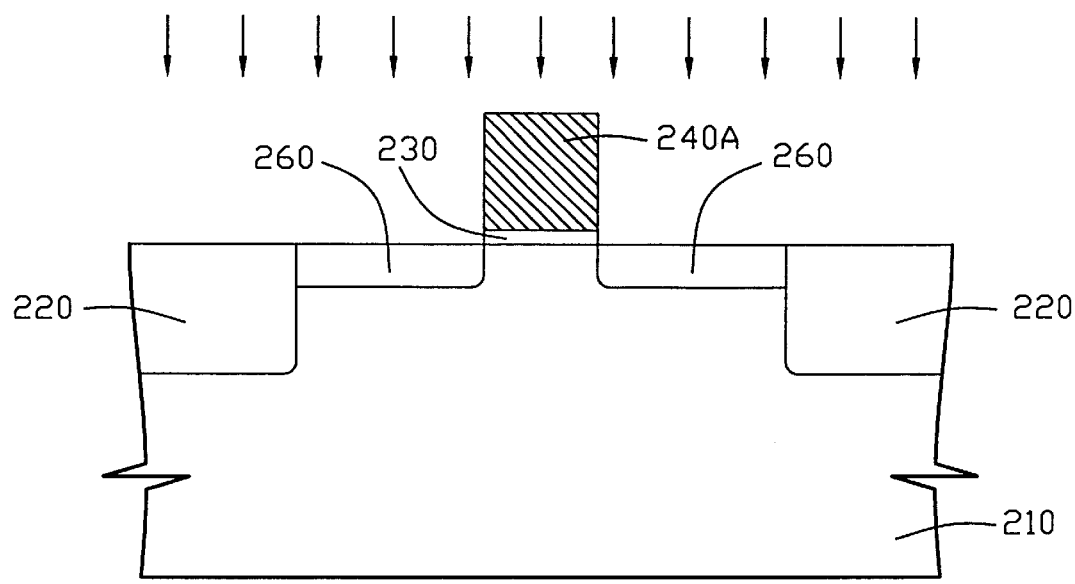
Figure 2E:
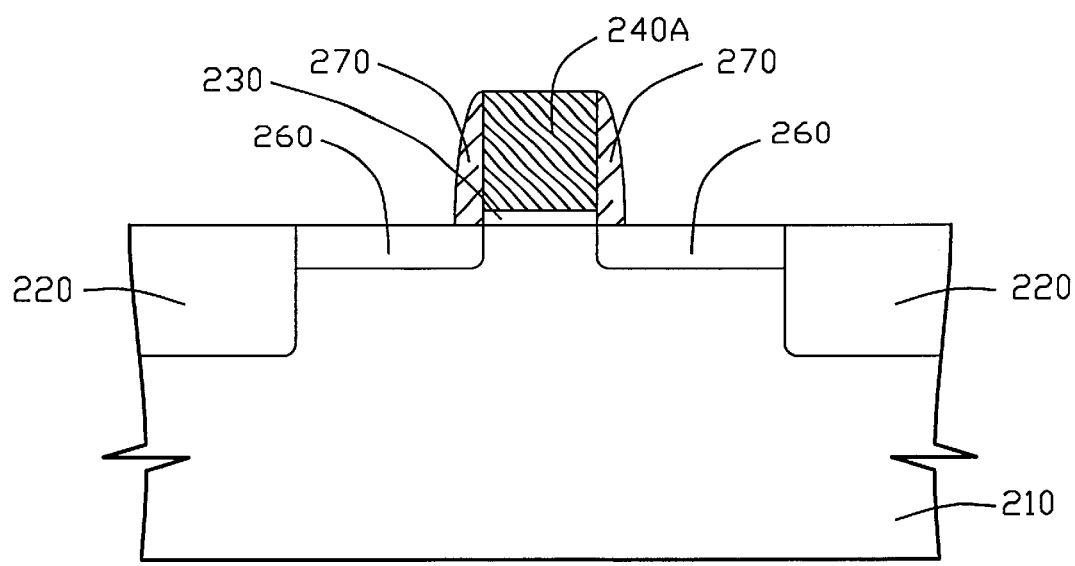

Referring to FIG. 2D, in this embodiment, the foresaid structure is performed the ion implantation with lightly doped drain (LDD) process to form a lightly doped drain region 260, then deposit a silicon dioxide layer on the surface of the foresaid structure and perform anisotropically etching on the foresaid structure which is covered by silicon dioxide layer. A portion of the silicon nitride layer which is adhered on dummy gate 240A spacer won't be removed completely, and so an oxide spacer 270 can be formed. The structure described above is shown in FIG. 2E.

Figure 2F:
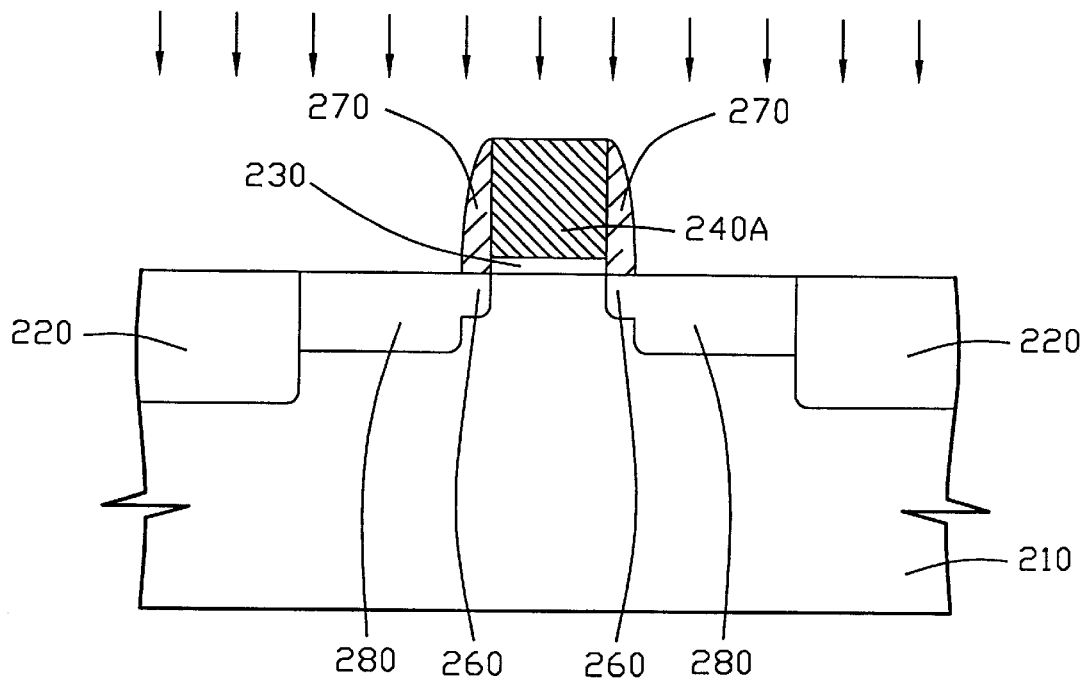

Referring to FIG. 2F, in this embodiment, the ion implantation with heavily doped drain (HDD) process is performed on the foresaid structure to form a source/drain region 280. Next, source/drain extension is formed by means of conducting an annealing process. Hence, oxide spacer 270 and source/drain 280 deep junction is formed.

Figure 2G:
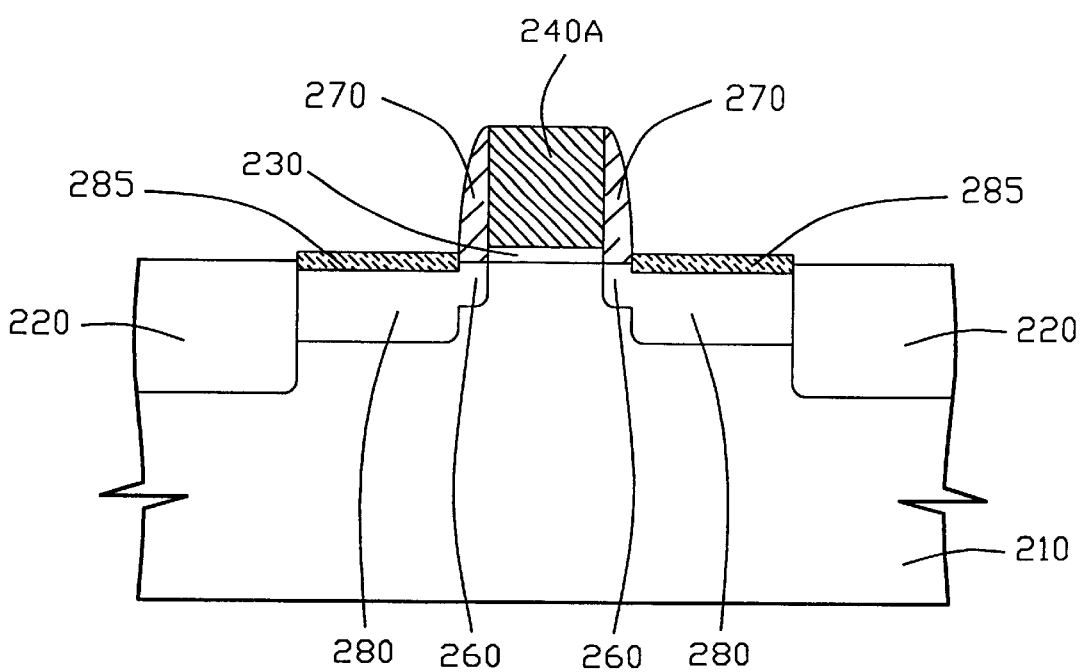
Figure 2H:
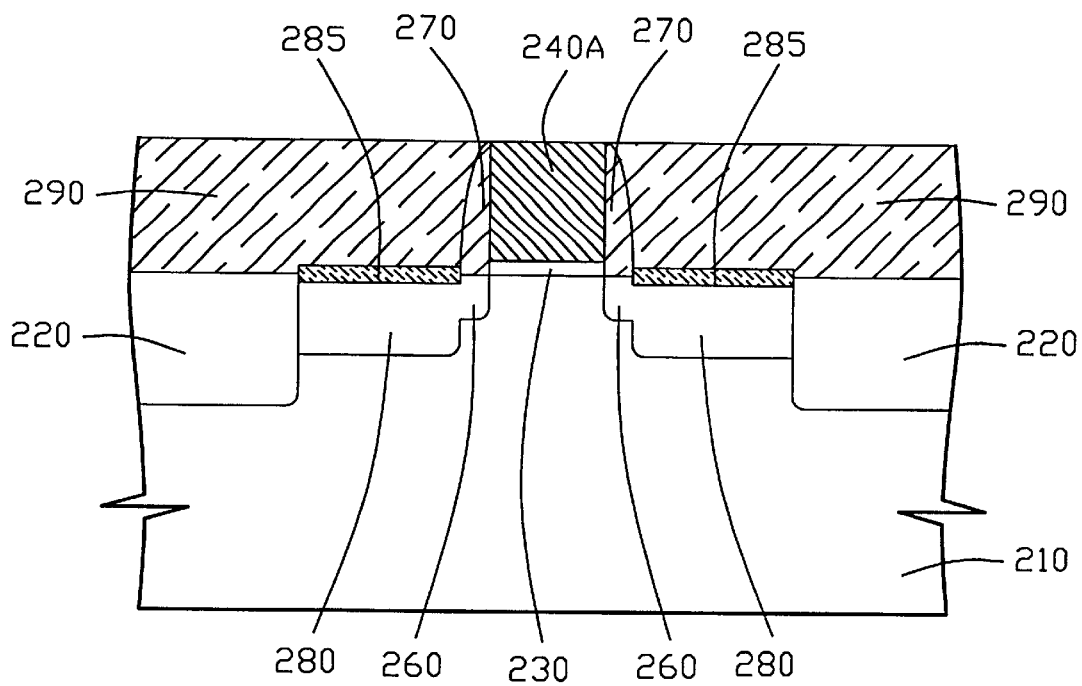

Referring to FIG. 2G, in this embodiment, thinner salicide is perform on source/drain 280 regions of the foresaid structure. Then, a silicon dioxide layer is deposited on the substrate 210, so as to be an inter layer dielectric (ILD) 290. A thick inter layer dielectric (ILD) 290 is deposited followed by post chemical mechanical polishing stop on this thickness of dummy gate 240A, as show in FIG. 2H.

Figure 2I:
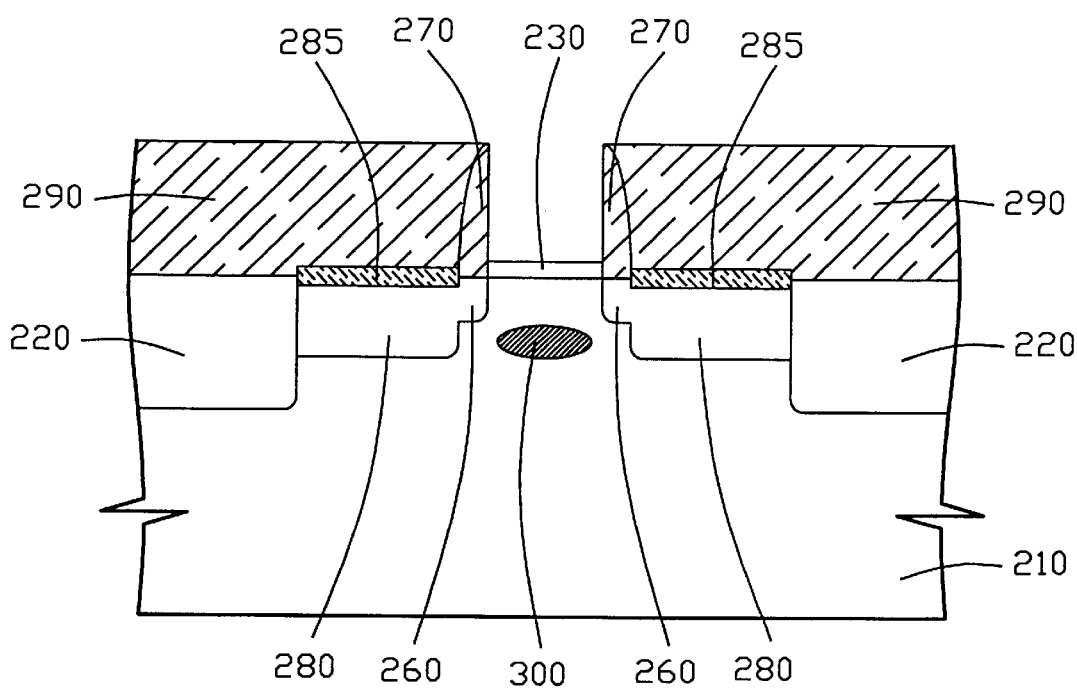

Referring to FIG. 2I, in this embodiment, with appropriate wet etching in a wet phosphoric acid solution, this dummy gate 240A can be removed, and then an anti punch-through 300 is formed between source/drain 280 after local punch-through implantation.

Figure 2J:
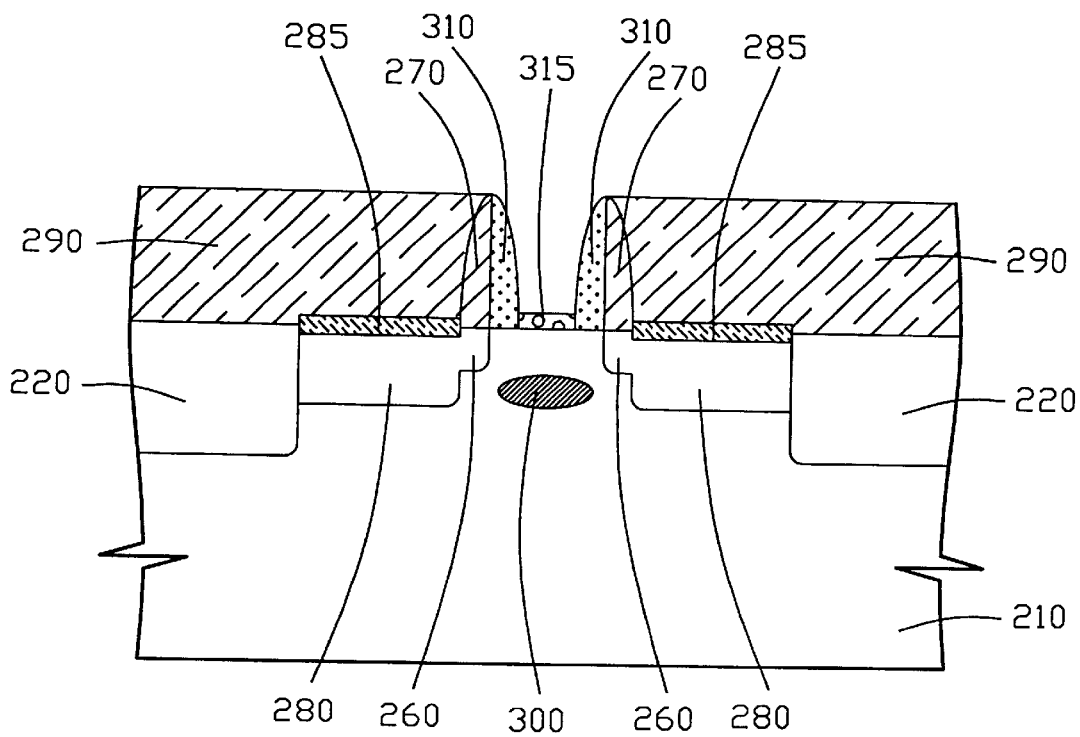

Referring to FIG. 2J, in this embodiment, a silicon nitride layer 310 is formed on the surface of the foresaid structure by conventional chemical vapor deposition (CVD). The silicon nitride layer 310 is etched by anisotropically etching, so as to form reverse offset-spacer 310 in the inner sidewall of the trench, which is the site of removing dummy gate 240A. Next, a thin gate oxide layer 315 is formed in the trench of the foresaid structure to after the oxide layer 230 is removed. The thickness of the thin gate oxide layer 315 is about 20 angstroms and 26 angstroms.

Figure 2K:
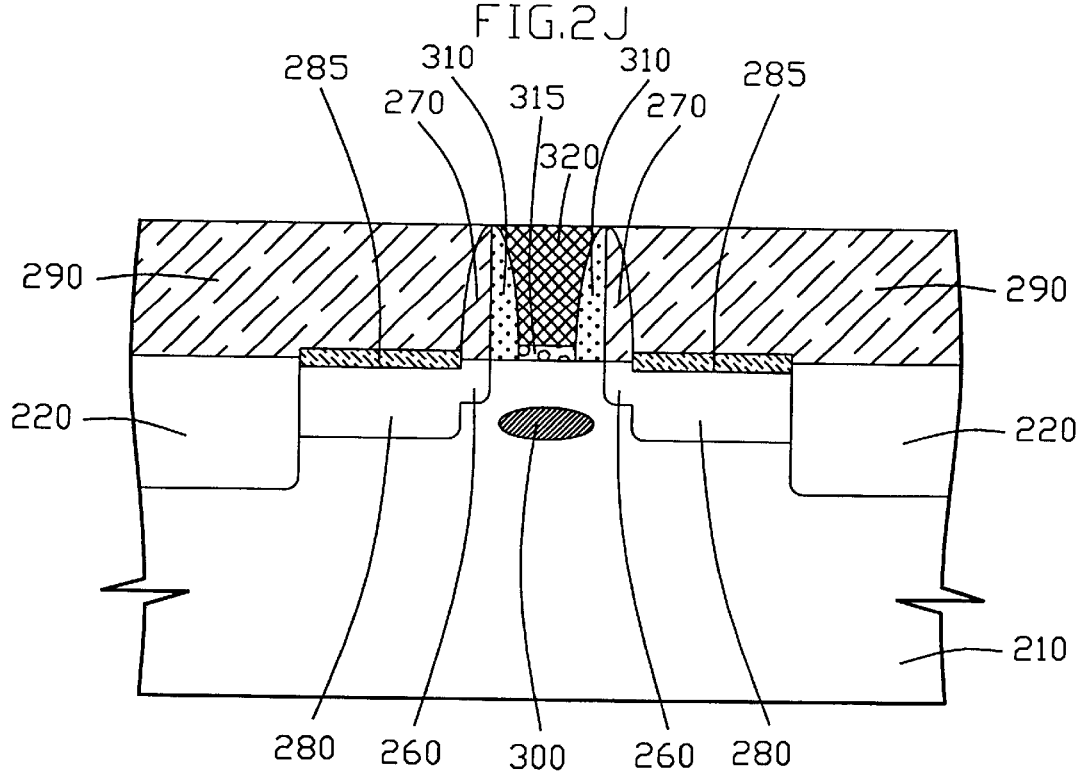
Figure 2L:
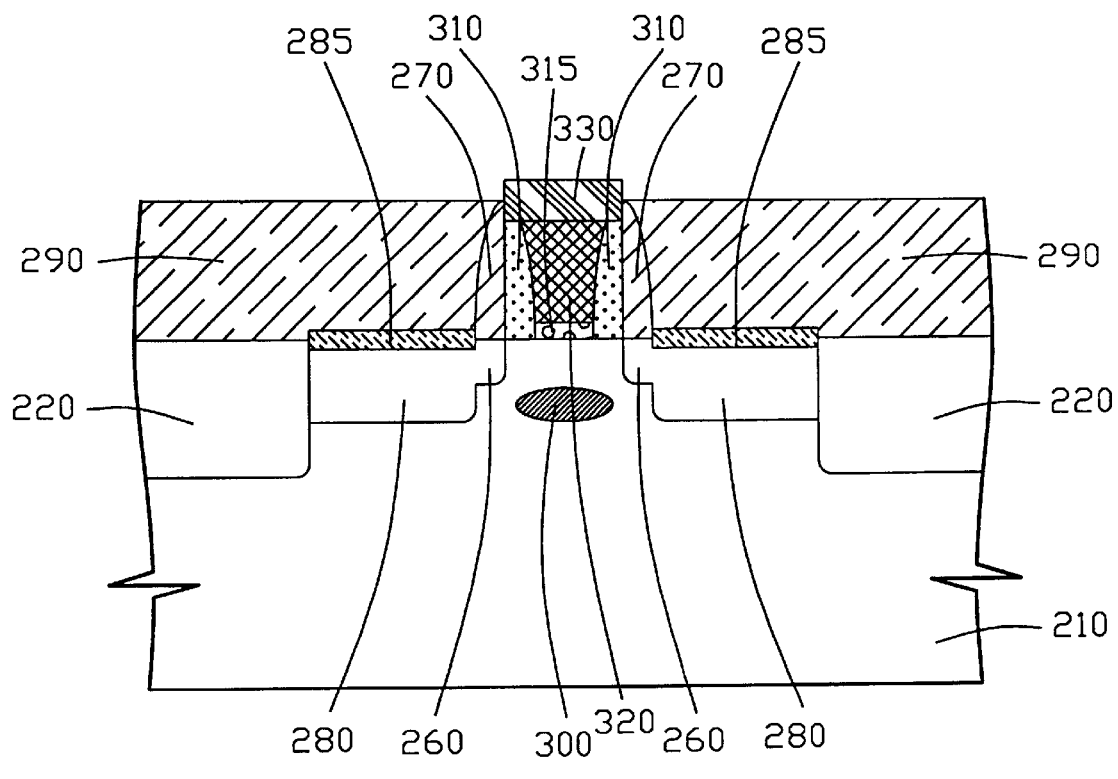

Referring to FIG. 2K, in this embodiment, a polysilicon layer 320 is deposited on the foresaid structure, and then a polysilicon layer 320 is deposited followed by post polysilicon chemical mechanical polishing stop on the inter layer dielectric (ILD) 290; thus, a polysilicon gate 320 is obtained. The final stage would be the procedure of forming thick Ti-saliciation 330. In this embodiment, Ti-saliciation 330 having a thickness of about between 300 angstroms and 800 angstroms, and saliciation 285 of source/drain 280 having a thickness of about between 150 angstroms and 300 angstroms.

Obviously, many modifications and variations of the present invention are possible in light of the above teachings. It is therefore to be understand that within the scope of the appended claims, the present invention may be practiced otherwise than as specifically described herein.

A preferred embodiment of the present invention will now be described in greater detail. Nevertheless, it should be recognized that the present invention can be practiced in a wide range of other embodiments besides those explicitly described, and the scope of the present invention is expressly not limited except as specified in the accompanying claims.

What is claimed is:

1. A method for forming a semiconductor device, comprising:

providing a semiconductor substrate;

forming a first oxide layer on said semiconductor substrate;

forming a dummy gate on said semiconductor substrate;

implanting first ion said semiconductor substrate using said dummy gate as a first mask to form a lightly doped drain region in said semiconductor substrate;

forming a first spacer on sidewall of said dummy gate;

implanting second ion said semiconductor substrate using said dummy gate and said first spacer as a second mask to form a source/drain region in said semiconductor substrate;

forming a first silicide layer on said source/drain region;

forming a dielectric layer over said semiconductor substrate, and a top surface of said dummy gate is exposed;

forming a trench by means of removing said dummy gate;

forming an antipunch-through region under said trench of said semiconductor substrate;

forming a second spacer in inner sidewall of said trench wherein said second spacer comprises a nitride layer;

removing said first oxide layer in said trench;

forming a second oxide layer in said trench;

forming a gate by means of depositing a conductive layer in said trench; and forming a second silicide layer on said gate.

2. The method according to claim 1, wherein said semiconductor substrate further comprises forming a shallow trench isolation region in said semiconductor substrate.

3. The method according to claim 1, wherein the method for forming said dummy gate comprises:

depositing a first silicon nitride layer on the semiconductor substrate; and defining and etching said first silicon nitride layer to take advantage of photolithography process for the purpose of forming said dummy gate.

4. The method according to claim 3, wherein said first silicon nitride layer is formed on said semiconductor substrate by means of chemical vapor deposition.

5. The method according to claim 1, wherein the method for forming said first spacer comprises:

depositing a first silicon dioxide layer on said semiconductor substrate; and etching said first silicon dioxide layer to take advantage of anisotropic etching, so as to form said first spacer on sidewall of said dummy gate.

6. The method according to claim 1, wherein said first silicide layer is formed on said source/drain region by means of salicidation.

7. The method according to claim 1, wherein the method for forming said dielectric layer comprises:

forming a silicon dioxide layer over said semiconductor substrate; and polishing said silicon dioxide layer by means of chemical mechanical polishing to expose top surface of said dummy gate.

8. The method according to claim 1, wherein said dummy gate is removed by wet etching, and so as to form said trench.

9. The method according to claim 8, wherein said wet etching uses phosphoric solution.

10. The method according to claim 1, wherein said antipunch-through region is formed by local punch-through implantation in said trench.

11. The method according to claim 1, wherein the method for forming said second spacer comprises:

depositing a silicon nitride layer on the semiconductor substrate, by means of chemical vapor deposition; and etching said silicon nitride layer by means of anisotropically etching for the purpose of forming said second spacer on inner sidewall surface of said trench.

12. The method according to claim 1, wherein said second oxide layer has a thickness that is about 20 angstroms and 26 angstroms.

13. The method according to claim 1, wherein said second silicide layer is formed on said gate by salicidation.

* * * * *